(12) United States Patent
Oka et al.

(10) Patent No.: US 7,572,428 B2
(45) Date of Patent: Aug. 11, 2009

(54) PROCESS FOR PRODUCING FLUORINE GAS

(75) Inventors: Masakazu Oka, Kasasaki (JP);
Tomoyuki Fukuyo, Kasasaki (JP);
Junichi Torisu, Kasasaki (JP)

(73) Assignee: Showa Denko K.K., Tokyo (JP)

( * ) Notice: Subject to any disclaimer, the term of this patent is extended or adjusted under 35 U.S.C. 154(b) by 136 days.

(21) Appl. No.: 11/663,635

(22) PCT Filed: Sep. 22, 2005

(86) PCT No.: PCT/JP2005/018065

§ 371 (c)(1),
(2), (4) Date: Mar. 23, 2007

(87) PCT Pub. No.: WO2006/033474

PCT Pub. Date: Mar. 30, 2006

(65) Prior Publication Data

US 2008/0102021 A1    May 1, 2008

Related U.S. Application Data

(60) Provisional application No. 60/624,528, filed on Nov. 4, 2004.

(30) Foreign Application Priority Data

Sep. 24, 2004    (JP) .............................. 2004-277382

(51) Int. Cl.
*C01B 7/20*    (2006.01)
*C01B 9/08*    (2006.01)

(52) U.S. Cl. ...................... 423/500; 423/503; 423/504; 137/338; 137/3; 137/896; 137/341; 422/198; 422/238; 422/239; 422/236

(58) Field of Classification Search ................. 423/500, 423/503, 504; 137/338, 3, 896, 341; 422/238, 422/239, 236, 188, 193, 194, 198, 199
See application file for complete search history.

(56) References Cited

U.S. PATENT DOCUMENTS 4,284,617 A * 8/1981 Bowen et al. ............... 423/504
4,506,140 A * 3/1985 Armstrong .................. 392/453

(Continued)

FOREIGN PATENT DOCUMENTS

EP    1 357 103 A1    10/2003

(Continued)

*Primary Examiner*—Ngoc-Yen M Nguyen
(74) *Attorney, Agent, or Firm*—Sughrue Mion, PLLC

(57) ABSTRACT

A process for producing a fluorine gas of the invention comprises a step (1) of generating a fluorine gas by sectioning the interior of a fluorine gas generation container equipped with a heating means, by the use of a structure having gas permeability, then filling each section with a high-valence metal fluoride and heating the high-valence metal fluoride. The process may comprise a step (2) of allowing the high-valence metal fluoride, from which a fluorine gas has been generated in the step (1), to occlude a fluorine gas. According to the process of the invention, a high-purity fluorine gas that is employable as an etching gas or a cleaning gas in the process for manufacturing semiconductors or liquid crystals can be produced inexpensively on a mass scale.

11 Claims, 6 Drawing Sheets

U.S. PATENT DOCUMENTS

| | | | |
|---|---|---|---|
| 5,363,396 A * | 11/1994 | Webb et al. | 372/57 |
| 6,609,540 B1 * | 8/2003 | Torisu et al. | 137/896 |
| 6,955,801 B2 * | 10/2005 | Torisu et al. | 423/500 |
| 2004/0028600 A1 | 2/2004 | Torisu et al. | |

FOREIGN PATENT DOCUMENTS

| | | |
|---|---|---|
| JP | 5-502981 A | 5/1993 |
| JP | 2003-081614 A | 3/2003 |
| SU | 1432001 A1 | 10/1988 |
| WO | WO 2004/056700 A1 | 7/2004 |

* cited by examiner

Section seen from above

PROCESS FOR PRODUCING FLUORINE GAS

CROSS REFERENCES OF RELATED APPLICATION

This application is an application filed under 35 U.S.C. §111(a) claiming benefit pursuant to 35 U.S.C. §119(e) of the filing date of Provisional Application 60/624,528 filed on Nov. 4, 2004, pursuant to 35 U.S.C. §111(b).

TECHNICAL FIELD

The present invention relates to a process for producing a fluorine gas by heating a metal fluoride.

BACKGROUND ART

Fluorine gas is used as a raw material for synthesizing various fluorides and is also used recently as a cleaning gas or an etching gas in the process for manufacturing semiconductors or liquid crystals.

For industrially producing a fluorine gas, a production process by electrolysis of a KF.2HF fused salt is generally employed. In case of such a conventional production process, however, there is a problem that impurity gases derived from electrodes or raw materials, such as HF, $O_2$, $N_2$, $CO_2$, $CF_4$ and $SiF_4$, are sometimes contained in the fluorine gas generated and it is difficult to obtain a high-purity fluorine gas. Of these impurity gases, HF can be relatively easily removed by the use of porous NaF, and other impurities can be removed by repeating distillation.

However, there occurs another problem that repetition of liquefaction and gasification for the purpose of purifying a fluorine gas is extremely dangerous because fluorine is a very active substance. Further, there is another problem that a very expensive material must be used for a distillation column because resistance to fluorine is necessary for the distillation column and distillation needs to be performed at very low temperatures. In addition, maintenance or safe operation of a fluorine electrolytic cell is difficult, and fluorine gas production facilities including equipment become very expensive unless they are used to a certain extent, so that it has been difficult to produce a fluorine gas at a low cost.

Furthermore, a fluorine gas is a combustion supporting gas having very strong oxidizing properties, and exhibits high toxicity and material corrosive properties. Therefore, a 100% fluorine gas is not commercially available in the form of a compression gas cylinder in Japan except special cases.

As a means to supply a fluorine gas other than a cylinder, a fluorine gas generator is disclosed in JP-T-5-502981 (WO91/18433). That is to say, a fluorine gas occluded by a solid is placed in a container (fluorine gas generator), and when a fluorine gas is needed, the container containing the solid is heated to generate a fluorine gas in accordance with a reaction represented by the following formula (I).

$$K_3NiF_7 \rightarrow K_3NiF_6 + 1/2 F_2 \qquad (I)$$

The purity of the fluorine gas obtained by the above method, however, is insufficient depending upon the purpose. Then, the present inventors have improved disadvantages of JP-T-5-502981 and established a process for producing a fluorine gas of higher purity (see JP-A-2003-81614).

As a metal fluoride capable of generating a fluorine gas other than the above $K_3NiF_7$, $MnF_4$ is heretofore known. However, a rate to generate a fluorine gas from such a metal fluoride, a purity of the resulting fluorine gas and a method to generate a fluorine gas on an industrial scale (kg unit or more) have not been studied so far.

In SU-A-1432001, a process for producing a fluorine gas using manganese fluoride as a fluorine gas generating agent is disclosed. More specifically, $MnF_3$ is vaporized as $MnF_4$ in a stream of fluorine, then the $MnF_4$ is cooled and captured, and the captured $MnF_4$ is heated to liberate fluorine.

In the process described in SU-A-1432001, however, there resides a problem that vaporization and capture of $MnF_4$ in a stream of fluorine must be repeated whenever fluorine is reoccluded, and this needs an extremely complicated system, resulting in a very expensive fluorine gas. Moreover, from the contents described in SU-A-1432001, $MnF_4$ is presumed to have sublimation properties, and therefore, it is necessary to protect a fluorine gas generated by heating $MnF_4$ from contamination with $MnF_4$.

Further, there is another problem. That is to say, when the high-valence metal fluoride filled in the container is heated to generate a fluorine gas, the generated fluorine gas comes into a gas phase through the filled solid phase. At this time, the generation rate of the fluorine gas is lowered under the influence of reabsorption of a fluorine gas or pressure loss due to the metal fluoride solid, and hence, a satisfactory generation rate cannot be obtained.

In recent years, a fluorine gas of higher purity has been desired in many use applications. For example, in the case where a rock is irradiated with laser in an atmosphere of a fluorine gas to determine a quantity of oxygen contained in the rock, it is required to reduce an oxygen gas concentration of the fluorine gas to the lowest.

Also in the case where a fluoride lens of an exposure device for manufacturing semiconductors is produced by excimer laser, a fluorine gas having a low oxygen gas concentration is desired because a transmittance of the resulting lens is lowered if the fluorine gas used contains an oxygen gas. Further, also for the emission of excimer laser using a fluorine gas, a fluorine gas containing small quantities of impurity gases such as an oxygen gas is indispensable as a fluorine gas to be filled or supplemented into a laser chamber.

In the fields of electronic industry such as a field of semiconductors where a fluorine gas is used as an etching gas or it is used as a cleaning gas of CVD chamber because of its small factor of global warming, a high-purity fluorine gas containing smaller quantities of impurities then ever is desired. Because, with progress of fine processing technique, impurities contained in the fluorine gas further deteriorate yields of manufactured products to thereby lower production efficiency, and the global environmental problem should be further tackled.

DISCLOSURE OF INVENTION

It is an object of the present invention to provide a process for producing a high-purity fluorine gas by which a high-purity fluorine gas that is employable as an etching gas or a cleaning gas in the process for manufacturing semiconductors or liquid crystals can be produced inexpensively on a mass scale.

In order to solve the above problems, the present inventors have earnestly studied. As a result, they have found that by sectioning the interior of a fluorine gas generation container by means of a structure having gas permeability, then filling each section with a high-valence metal fluoride and heating the high-valence metal fluoride to generate a fluorine gas, the fluorine gas generated can be made to pass toward the upper part of the container through the structure having gas permeability, and hence, generation of a fluorine gas can be carried out at a satisfactory generation rate without reabsorption of a fluorine gas by the metal fluoride. Based on the finding, the present invention has been accomplished.

That is to say, the present invention relates to a process for producing a fluorine gas that is stated in the following [1] to [16].

[1] A process for producing a fluorine gas, comprising a step (1) of generating a fluorine gas by sectioning the interior of a fluorine gas generation container equipped with a heating means, by the use of a structure having gas permeability, then filling each section with a high-valence metal fluoride and heating the high-valence metal fluoride.

[2] A process for producing a fluorine gas, comprising a step (1) of generating a fluorine gas by sectioning the interior of a fluorine gas generation container equipped with a heating means, by the use of a heat-transfer structure comprising a structure having gas permeability and a heat transfer member, then filling each section with a high-valence metal fluoride and heating the high-valence metal fluoride.

[3] The process for producing a fluorine gas as stated in the above [1] or [2], wherein the structure having gas permeability is a foam metal.

[4] The process for producing a fluorine gas as stated in the above [2], wherein the heat transfer member is a metal punching plate.

[5] The process for producing a fluorine gas as stated in the above [2], wherein the heat-transfer structure is a structure wherein a foam metal is sandwiched between metal punching plates.

[6] The process for producing a fluorine gas as stated in any one of the above [1] to [5], wherein the high-valence metal fluoride contains at least one composition selected from $MnF_x$ (x=3-4) and $K_3NiF_y$ (y=6-7).

[7] The process for producing a fluorine gas as stated in any one of the above [1] to [5], wherein the high-valence metal fluoride comprises $MnF_x$ (x=3-4).

[8] The process for producing a fluorine gas as stated in any one of the above [1] to [7], wherein the temperature for heating the high-valence metal fluoride in the step (1) is in the range of 300 to 450° C.

[9] The process for producing a fluorine gas as stated in any one of the above [1] to [8], which comprises a step (2) of allowing the high-valence metal fluoride, from which a fluorine gas has been generated in the step (1), to occlude a fluorine gas.

[10] The process for producing a fluorine gas as stated in the above [7], which comprises a step of removing manganese fluoride contained in the fluorine gas generated by heating the high-valence metal fluoride.

[11] The process for producing a fluorine gas as stated in the above [10], wherein the step of removing manganese fluoride is carried out by cooling the fluorine gas containing the manganese fluoride.

[12] The process for producing a fluorine gas as stated in the above [11], wherein the temperature for cooling the fluorine gas containing the manganese fluoride is in the range of −50 to 200° C.

[13] The process for producing a fluorine gas as stated in the above [10], wherein the step of removing manganese fluoride is carried out by bringing the fluorine gas containing the manganese fluoride into contact with a metal fluoride.

[14] The process for producing a fluorine gas as stated in the above [13], wherein the metal fluoride used in the step of removing manganese fluoride contains at least one metal selected from the group consisting of an alkali metal, an alkaline earth metal, Al, Cu, Zn and Fe.

[15] The process for producing a fluorine gas as stated in the above [13], wherein the metal fluoride used in the step of removing manganese fluoride is NaF.

[16] A fluorine gas production apparatus comprising a fluorine generating agent container, a means for heating the container and a structure having gas permeability and heat transfer property for sectioning the interior of the container.

According to the present invention, a high-purity fluorine gas having a purity of not less than 99.9% wherein impurity gases such as HF, $O_2$, $N_2$, $CO_2$, $CF_4$ and $SiF_4$, have been remarkably reduced can be produced inexpensively.

According to the present invention, further, there is no influence of reabsorption of a fluorine gas or pressure loss due to a solid phase of a metal fluoride because a passageway of a fluorine gas generated is ensured. Therefore, a generation rate of a fluorine gas can be raised, and a high-purity fluorine gas can be supplied in a large quantity.

Figure 1:
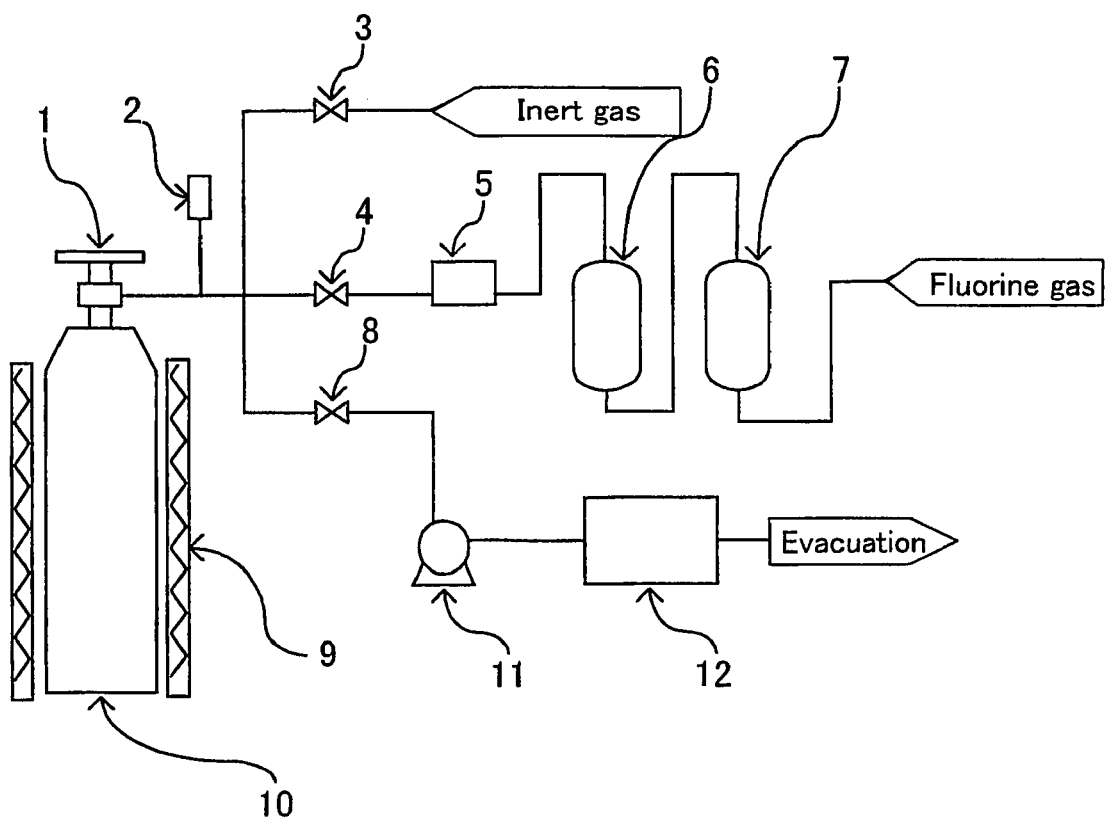
FIG. 1 is a schematic view showing an example of a fluorine gas production apparatus used in the present invention.

1: container main valve
2: pressure gauge
3: stop valve
4: stop valve
5: mass flow controller
6: cushion tank
7: NaF-filled tank
8: stop valve
9: heater
10: fluorine generating agent container
11: vacuum pump
12: harm-removing tank
13: container main valve
14: fluorine generating agent container
15: heater
16: pressure gauge
17: stop valve
18: stop valve
19: stop valve
20: container main valve
21: fluorine generating agent container
22: heater
23: pressure gauge
24: stop valve
25: stop valve
26: stop valve
27: stop valve
28: stop valve
29: mass flow controller
30: line filter
31: stop valve
32: vacuum pump
33: harm-removing tank
34: container main valve
35: heat transfer member 36: fluorine generating agent
37: fluorine generating agent container
38: heat-transfer structure
39: foam metal
40: punching plate
41: punching plate
42: metal fluoride container
43: metal fluoride container
44: container main valve
45: cold air blower
46: filter
47: metal fluoride for removal
48: heat transfer member
49: fluorine generating agent
50: fluorine generating agent container

BEST MODE FOR CARRYING OUT THE INVENTION

The process for producing a fluorine gas of the present invention is described in detail hereinafter.

The process for producing a fluorine gas of the present invention comprises a step (1) of generating a fluorine gas by sectioning the interior of a fluorine gas generation container equipped with a heating means, by the use of a structure having gas permeability or the use of a heat-transfer structure comprising a structure having gas permeability and a heat transfer member, then filling each section with a high-valence metal fluoride and heating the high-valence metal fluoride.

The process for producing a fluorine gas of the invention may comprise a step (2) of allowing the high-valence metal fluoride, from which a fluorine gas has been generated to decrease the valence, to occlude a fluorine gas, whereby the high-valence metal fluoride can be recycled.

The term "metal fluoride" used in this specification means a compound obtained by fluorinating a metal or a metal salt with a fluorinating agent having low oxidizing power such as HF, and the term "high-valence metal fluoride" means a compound in which a valence of metal has been increased by treating the above-mentioned metal fluoride with a fluorinating agent having high oxidizing power. In case of, for example, a manganese compound, $MnF_2$ is a metal fluoride, and $MnF_3$ or $MnF_4$ is a high-valence metal fluoride.

The high-valence metal fluoride for use in the invention is not specifically restricted provided that it is a high-valence metal fluoride (also referred to as a "fluorine generating agent" hereinafter) that is stably present as a solid and generates fluorine by heating. Examples of such metal fluorides include $MnF_x$ (x=3-4), $K_3NiF_y$ (y=6-7) and $CeF_4$. Preferable is a metal fluoride containing at least one composition selected from $MnF_x$ (x=3-4) and $K_3NiF_y$ (y=6-7). $MnF_4$ is more preferable because it can generate a fluorine gas of not less than 10% by mass by heating.

The expression "fluorine gas of not less than 10% by mass" means that, for example, in the following reaction formula (II), a proportion of a fluorine gas in the right-hand member generated from the metal fluoride in the left-hand member is not less than 10% by mass.

$$MnF_4 \rightarrow MnF_3 + 1/2 F_2 \quad (II)$$

The quantity of a fluorine gas generated from $MnF_4$ in the reaction formula (II) is 15% by mass. Accordingly, $MnF_4$ is preferable also from the viewpoints of energy in increase of temperature, labor in decrease of temperature and cost of a material of the fluorine gas generation container.

Since manganese fluoride does not exist as a monomolecule, $MnF_3$ state and $MnF_4$ state are present as a mixture in its crystal structure. Therefore, in the case where 50% of $MnF_3$ state and 50% of $MnF_4$ state are contained in the crystal structure, such manganese fluoride is expressed as $MnF_{3.5}$ in this specification. The valence is sometimes expressed as a number containing a decimal point in this way, so that manganese fluoride is sometimes expressed as $MnF_x$ (x=3-4) in this specification. The same shall apply to other metal fluorides.

To supply the fluorine gas generated as above, the pressure of the generation container needs to be higher than the pressure of the destination of supply, so that the pressure of the fluorine gas needs to be controlled by the heating temperature. The pressure of the fluorine gas at the time the fluorine gas is generated by heating the high-valence metal fluoride is exponentially increased with increase in the temperature. In the case where the fluorine gas generation container is designed to be pressure-resistant, the wall thickness of the container should be made larger with increase in the temperature, and consequently, the fluorine gas generation container becomes very expensive.

Accordingly, the temperature for generating a fluorine gas using the high-valence metal fluoride is in the range of preferably 300 to 450° C., more preferably 330 to 420° C., particularly preferably 350 to 400° C. When the temperature for generating a fluorine gas is in the above range, a fluorine gas is generated and control of a pressure and a flow rate can be facilitated. As a result, supply of a fluorine gas can be favorably carried out, and increase of the cost of the fluorine gas generation container can suppressed.

By heating the high-valence metal fluoride as above, a fluorine gas can be generated, but if the high-valence metal fluoride is only filled into a container, a satisfactory fluorine gas generation rate cannot be obtained, and supply of a fluorine gas in a large quantity of a practical level that is an object of the present invention sometimes becomes infeasible.

As the reason why a satisfactory fluorine gas generation rate is not obtained, it is thought that passing of the generated fluorine gas is inhibited by pressure loss due to the metal fluoride in a solid phase. Further, in the case where $MnF_4$ is used as the high-valence metal fluoride, the reaction to generate $F_2$ from $MnF_4$ that is represented by the following reaction formula (III) and the reaction of $F_2$ with $MnF_3$ that is represented by the following reaction formula (IV) are in equilibrium with each other, so that it is thought that the fluorine gas generated is reabsorbed by $MnF_3$ through the contact of the fluorine gas with $MnF_3$.

$$MnF_4 \rightarrow 1/2 F_2 + MnF_3 \quad (III)$$

$$MnF_3 + 1/2 F_2 \rightarrow MnF_4 \quad (IV)$$

Accordingly, in order to increase the fluorine gas generation quantity, it is necessary to ensure a passageway of the fluorine gas generated. As a method to ensure a passageway of the fluorine gas, there can be mentioned, for example, a method comprising sectioning the interior of a fluorine gas generation container by a structure having gas permeability and filling each section with a high-valence metal fluoride in such a manner that the structure having gas permeability is not buried.

In usual, only an upper part of a filled solid phase composed of a high-valence metal fluoride comes into contact with a gas phase. However, by sectioning the interior of the container in the above manner, the lower part of the filled solid phase and the gas phase on the upper part are connected through the structure having gas permeability. Therefore, passing of the generated fluorine gas can be protected from inhibition by pressure loss due to the solid phase composed of the metal fluoride, and besides, reabsorption of the generated fluorine gas by the equilibrium reaction can be prevented. As a result, a fluorine gas generation rate of industrially practical level is obtained.

The structure having gas permeability for use in the invention is not specifically restricted provided that it enables passing of a fluorine gas between the lower part of the filled solid phase and the gas phase on the upper part of the filled solid phase, and for example, a foam metal made of commercially available stainless steel is employable. Such a foam metal desirably has a porosity of not less than 85%, preferably not less than 90%, particularly preferably not less than 95%.

Since the reaction to generate a fluorine gas is an endothermic reaction, heat transfer to the high-valence metal fluoride from a heating means equipped on the fluorine gas generation container, such as an external heater, becomes insufficient, and hence the fluorine gas generation rate is sometimes lowered. In order to heat the high-valence metal fluoride as efficiently as possible to thereby prevent lowering of a fluorine gas generation rate, it is desirable to install a heat transfer member inside the container to be filled with the high-valence metal fluoride. If a part of the heat transfer member is in contact with an inner surface of the container, heat transfers to the high-valence metal fluoride, and insufficiency of heat transfer accompanying the endothermic reaction can be prevented.

Figure 4:
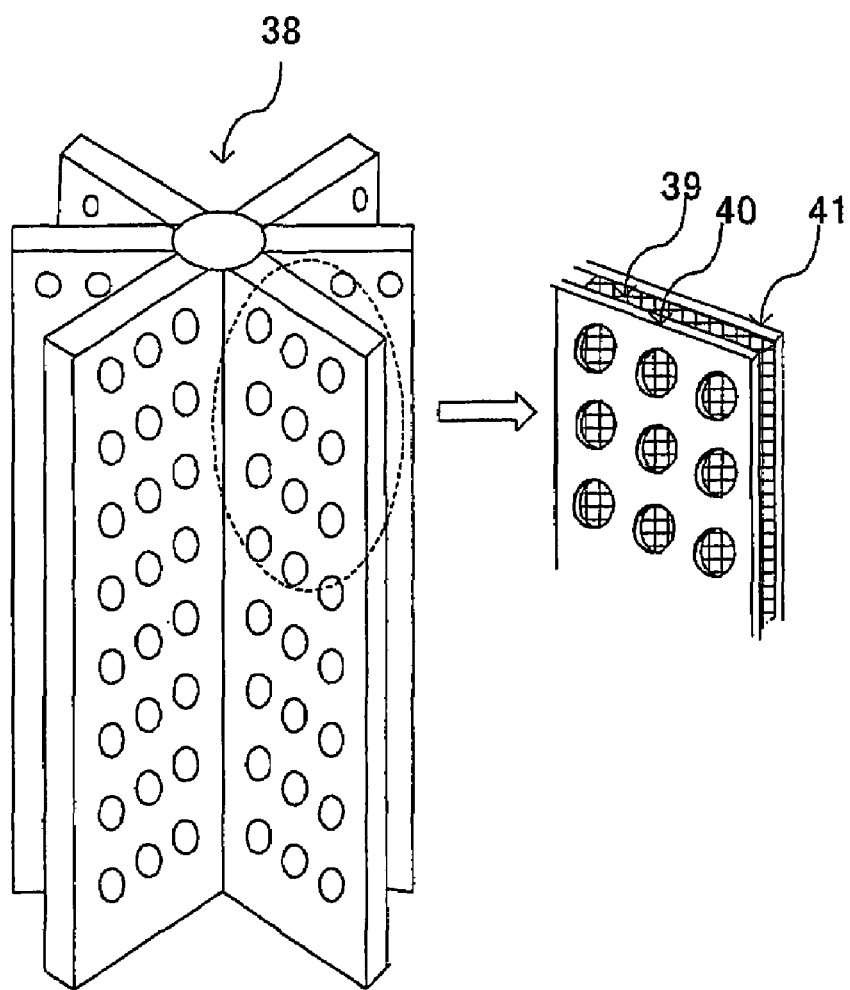
FIG. 4 is a schematic view showing an example of a heat-transfer structure used in the present invention.

The heat transfer member is desirably installed perpendicularly to the fluorine gas generation container because a fluorine gas generated is released without being obstructed by the heat transfer member. Further, a heat-transfer structure comprising the structure having gas permeability and the heat transfer member is preferably employed. More specifically, by the use of a heat-transfer structure of sandwich type wherein a foam metal is sandwiched between metal punching plates as shown in FIG. 4, an effect of heat transfer and an effect of ensuring a passageway of a fluorine gas generated can be both obtained.

If the heat-transfer structure, specifically a heat-transfer structure wherein a foam metal is sandwiched between punching plates, is installed inside the reaction container as described above, heat transfer to the high-valence metal fluoride filled in the container is sufficiently carried out even if the size of the reaction container is made larger, and a fluorine gas can be efficiently generated. In case of for example $MnF_4$, a fluorine gas generation rate of usually not less than 100 ml/min, preferably not less than 200 ml/min, based on 1 kg of $MnF_4$ can be maintained.

By ensuring a passageway between the lower part of the filled solid phase and the gas phase on the upper part of the filled solid phase, the reaction of occlusion of a fluorine gas by the metal fluoride after generation of a fluorine gas can be efficiently carried out for a short period of time.

In the case where $MnF_4$ is used as the high-valence metal fluoride, $MnF_4$ is sometimes sublimated, though slightly, at the temperature for generating a fluorine gas, so that there is a possibility that manganese fluoride is contained in the generated fluorine gas. If manganese fluoride is contained in the fluorine gas, evil influence is exerted depending upon the purpose, and therefore, it is preferable to remove it in advance.

The sublimated manganese fluoride may be removed by the use of a line filter equipped just before the destination of supply. In this case, however, there is a possibility that a line before the line filter is contaminated by adhesion of manganese fluoride and the manganese fluoride undergoes hydrolysis reaction to form hydrogen fluoride in the overhaul inspection or the like. Therefore, it is preferable to install the filter at the upper part of the fluorine gas generation container.

When the manganese fluoride is heated to a temperature of not lower than 300° C. that is a fluorine gas generation temperature in the present invention, it sometimes has vapor pressure slightly. Therefore, it is desirable to cool the filter to a temperature of −50 to 200° C., preferably 0 to 100° C., particularly preferably 0 to 50° C. When the cooling temperature is in the above range, manganese fluoride contained in the generated fluorine gas can be efficiently removed, and a purified fluorine gas can be obtained.

The cooling method employable herein is not specifically restricted provided that the upper part of the container including the filter can be cooled to not higher than a given temperature. For example, a method wherein cool air is applied to cool the filter or a method wherein the upper part of the fluorine gas generation container is made to have a double-wall structure and a cooling medium is allowed to pass through the outer side is employable.

If a mesh of the filter is too large, manganese fluoride may possibly pass through the filter, so that the mesh is preferably not more than 200 μm, more preferably not more than 100 μm, particularly preferably not more than 50 μm. By further installing a filter of not more than 0.05 μm as a line filter just before the destination of supply, manganese fluoride can be removed almost completely.

When manganese fluoride is heated, it reacts with a fluoride of a metal, such as an alkali metal, an alkaline earth metal, Al, Cu, Zn or Fe, to form a composite metal fluoride compound. Therefore, by the use of such a metal fluoride (also referred to as a "metal fluoride for removal" hereinafter), the sublimated $MnF_4$ can be removed. For example, when NaF and $MnF_4$ are brought into contact with each other by mixing and then heated, a composite fluoride is formed in accordance with the reaction formula $2NaF+MnF_4 \rightarrow Na_2MnF_6$, and the sublimated manganese fluoride contained in the fluorine gas can be removed.

As a specific removal method, a method of providing, as a line filter, a container filled with a metal fluoride for removal is thought. The metal fluoride for removal is not specifically restricted provided that it is the aforesaid metal fluoride, but from the viewpoints of ease of obtaining, handling properties and cost, commercially available NaF pellets can be preferably employed. The size of the filter container to be filled with the metal fluoride for removal has only to be a size capable of ensuring a contact time enough to remove manganese fluoride from the generated fluorine gas, and for example, SV (space velocity) is desired to be not more than 1000 $hr^{-1}$, preferably not more than 500 $hr^{-1}$. In order to promote the reaction of $MnF_4$ with the metal fluoride, the reaction temperature is in the range of preferably 50 to 400° C., more preferably 80 to 300° C., particularly preferably 100 to 200° C.

After manganese fluoride is introduced as the high-valence metal fluoride into the fluorine gas generation container, the metal fluoride for removal can be further introduced on the manganese fluoride, whereby manganese fluoride having been slightly sublimated in the fluorine gas generation container can be allowed to directly react with the metal fluoride for removal and thereby removed. If the quantity of the metal fluoride for removal is too large, the quantity of the manganese fluoride filled as a raw material is decreased and the quantity of a fluorine gas generated per container is decreased. Therefore, the metal fluoride for removal is preferably introduced in a quantity of not more than 10% of the volume of the manganese fluoride as a raw material. The metal fluoride for removal is preferably in the form of a powder or porous pellets because with increase of the contact area, formation of a composite fluoride is further promoted.

In order to make the temperature in the container as uniform as possible, the heater that is provided outside the fluorine gas generation container is preferably used in the invention in such a manner that the heater is wound densely on the place (upper and lower parts of the container) where heat dissipation is great and the heater is wound sparsely on the place (central part of the container) where heat dissipation is small.

If the size of the fluorine gas generation container is made larger to increase the quantity of the fluorine gas generated, the time for cooling the container in the exchange of the container or the like sometimes becomes extremely long. Therefore, $N_2$ for cooling may be allowed to pass on the outer surface of the container, whereby the time for cooling the container can be shortened.

In the present invention, the high-valence metal fluoride contained in the container is heated to generate a fluorine gas, and the fluorine gas is supplied. In the present invention, there may be adopted a system wherein generation of a fluorine gas is carried out using one fluorine gas generation container and when the high-valence metal fluoride loses fluorine gas generation ability, the fluorine gas generation container is properly replaced with another fluorine gas generation container to start reaction. However, in the case where the fluorine gas needs to be stably supplied continuously, a system wherein two or more fluorine gas generation containers are used and they are properly switched may be adopted. More specifically, two or more fluorine gas generation containers are arranged in parallel, and one of them is used while the other is held in a state of stand-by. When the fluorine gas generation ability of the fluorine gas generation container used is lowered, switching to the fluorine gas generation container in a state of stand-by is performed, whereby the fluorine gas can be stably supplied continuously.

Switching between two or more containers may be performed when the fluorine gas generation ability is lowered, but in order to stably supply the fluorine gas, it is preferable to perform switching when some ability of fluorine gas generation remains. For managing the switching, a system wherein the quantity of a fluorine gas generated per container is managed by an integrating flowmeter for a fluorine gas and when a given quantity of a fluorine gas generated is reached, switching is performed, a system wherein a weight of the fluorine gas generation container is measured and when a given value of a loss in weight of the container attributable to the generation of a fluorine gas is reached, switching is performed, etc. are adoptable. From these managing systems, a most preferred system is properly selected taking the purpose, etc. into consideration.

Next, an example of the process for producing a fluorine gas using manganese fluoride as a high-valence metal fluoride is described.

The process for producing a fluorine gas of the invention comprises a step (1) of generating a fluorine gas by heating manganese fluoride filled in a fluorine gas generation container. This process preferably comprises a step (2) of allowing manganese fluoride to occlude a fluorine gas, and more preferably comprises a step (3) of heating manganese fluoride filled in the container to 300 to 600° C. and reducing the pressure in the container to not more than 0.01 MPa (absolute pressure).

The expression "occlusion of a fluorine gas" means a phenomenon that a fluorine gas and a metal or a metal compound react with each other to form a fluorine compound. For example, chemical change in case of occlusion of a fluorine gas by manganese fluoride ($MnF_3$) is represented by the following formula.

$$2MnF_3 + F_2 \rightarrow 2MnF_4$$

The expression "generation of a fluorine gas" means a phenomenon that a fluorine gas is liberated by the reaction reverse to the occlusion. For example, chemical change in the case where the manganese fluoride ($MnF_4$) having occluded a fluorine gas generates a fluorine gas is represented by the following formula.

$$2MnF_4 \rightarrow 2MnF_3 + F_2$$

In the present invention, behaviors of an impurity gas contained in the fluorine gas are expressed using the terms "adsorption" and "desorption". The term "adsorption" means, for example, a state of physical adsorption where an impurity gas is attracted onto a surface of manganese fluoride mainly by intermolecular force of weak bond strength, and the term "desorption" means, for example, that the impurity gas having been adsorbed on a surface of manganese fluoride is desorbed and diffused.

The process for producing a fluorine gas of the invention preferably comprises a step (4) of setting the temperature of manganese fluoride filled in the container to not higher than 300° C. and reducing the pressure in the container to not more than 0.01 MPa (absolute pressure). The temperature in the step (4) is in the range of preferably not lower than 20° C. and lower than 300° C., more preferably not lower than 100° C. and lower than 300° C. In the step (4), the pressure is preferably reduced to not more than 0.001 MPa.

The main purpose of the step (3) and the step (4) is to remove, from manganese fluoride, impurities previously present in the manganese fluoride, by means of desorption, and depending upon the heating temperature, the impurities can be removed by desorption simultaneously with liberation of a fluorine gas.

The period of time and the number of times to carry out the step (3) and the step (4) are properly selected according to the purpose. The step (3) is desirably carried out twice or more, preferably three times or more. Although the period of time to carry out the step (3) varies depending upon the heating temperature, the step (3) is preferably carried out until liberation of a fluorine gas from manganese fluoride ceases. The step (4) is desirably carried out twice or more, preferably three times or more.

The size of the container to be filled with manganese fluoride can be selected according to the quantity of a fluorine gas generated. As a material of the container, a corrosion-resistant material, such as nickel, Monel or stainless steel, is preferably employed. It is more preferable to passivate the surface of such a material using a fluorine gas. Further, a surface of a metal material having been subjected to nickel plating may be passivated using a fluorine gas.

By repeating occlusion of a fluorine gas by manganese fluoride and generation of a fluorine gas from manganese fluoride in the process for producing a fluorine gas of the invention, impurities present in the manganese fluoride itself can be removed, and a purity of a fluorine gas generated can be enhanced.

However, removal of HF contained as impurities is sometimes infeasible even if occlusion and generation of a fluorine gas are repeated. It is thought that if HF is adsorbed on manganese fluoride, occlusion of a fluorine gas by the manganese fluoride is inhibited, and besides, substances such as $O_2$ gas and $CO_2$ gas are liable to be incorporated and removal thereof by desorption becomes difficult.

Therefore, the content of HF in a fluorine gas to be occluded by manganese fluoride (also referred to as a "fluorine gas for occlusion" hereinafter) is desired to be not more than 500 ppm by volume, preferably not more than 100 ppm by volume. When the content of HF is in the above range, occlusion of a fluorine gas is not inhibited, and removal of impurity gases such as $O_2$ gas and $CO_2$ gas can be facilitated.

As the fluorine gas for occlusion, a fluorine gas generated in the step (1) may be recycled, or a fluorine gas roughly purified separately may be used. However, in the case where a fluorine gas generated from manganese fluoride contains HF in a quantity of not less than 500 ppm by volume, a roughly purified fluorine gas from which HF and the like have been removed separately is preferably occluded instead of directly recycling the fluorine gas containing HF.

The fluorine gas for occlusion is an undiluted fluorine gas, and the type thereof is not specifically restricted provided that its purity is not less than 95%. For example, a purified fluorine gas obtained by removing HF using NaF from a fluorine gas having been generated by electrolysis in an electrolytic cell or a high-purity fluorine gas generated in the fluorine gas generation container of the invention is employable. When the fluorine gas for occlusion is occluded by manganese fluoride, the pressure of the fluorine gas is preferably not less than 0.2 MPa, and the temperature is preferably in the range of 100 to 400° C.

The fluorine gas obtained by the production process of the invention has a purity of not less than 99.9% by volume, and a high-purity fluorine gas having a purity of not less than 99.99% by volume can be also obtained. The content of an oxygen gas in the fluorine gas obtained by the production process of the invention is not more than 10 ppm by volume, and the content of a carbon dioxide gas is not more than 10 ppm by volume.

On the other hand, analysis of a fluorine gas obtained by conventional electrolysis resulted in a purity of about 99.7%l by volume, and resulted in, as impurity concentrations, a concentration of HF of 1500 ppm by volume, a concentration of $O_2$ gas of 200 ppm by volume, a concentration of $CO_2$ gas of 250 ppm by volume, a concentration of $N_2$ gas of 500 ppm by volume, a concentration of $CF_4$ gas of 400 ppm by volume, and a concentration of $SiF_4$ gas of 250 ppm by volume. Therefore, the fluorine gas of the invention proved to be a high-purity fluorine gas containing small quantities of impurity gases.

The content of an oxygen gas, a carbon dioxide gas or the like in the fluorine gas can be determined by, for example, allowing $K_3NiF_6$ that is a fluoronickel compound to occlude the fluorine gas and analyzing unoccluded oxygen gas, carbon dioxide gas or the like by the use of a gas chromatograph. The purity of the fluorine gas can be determined as a value obtained by subtracting the contents of these impurities from 100%.

Figure 2:
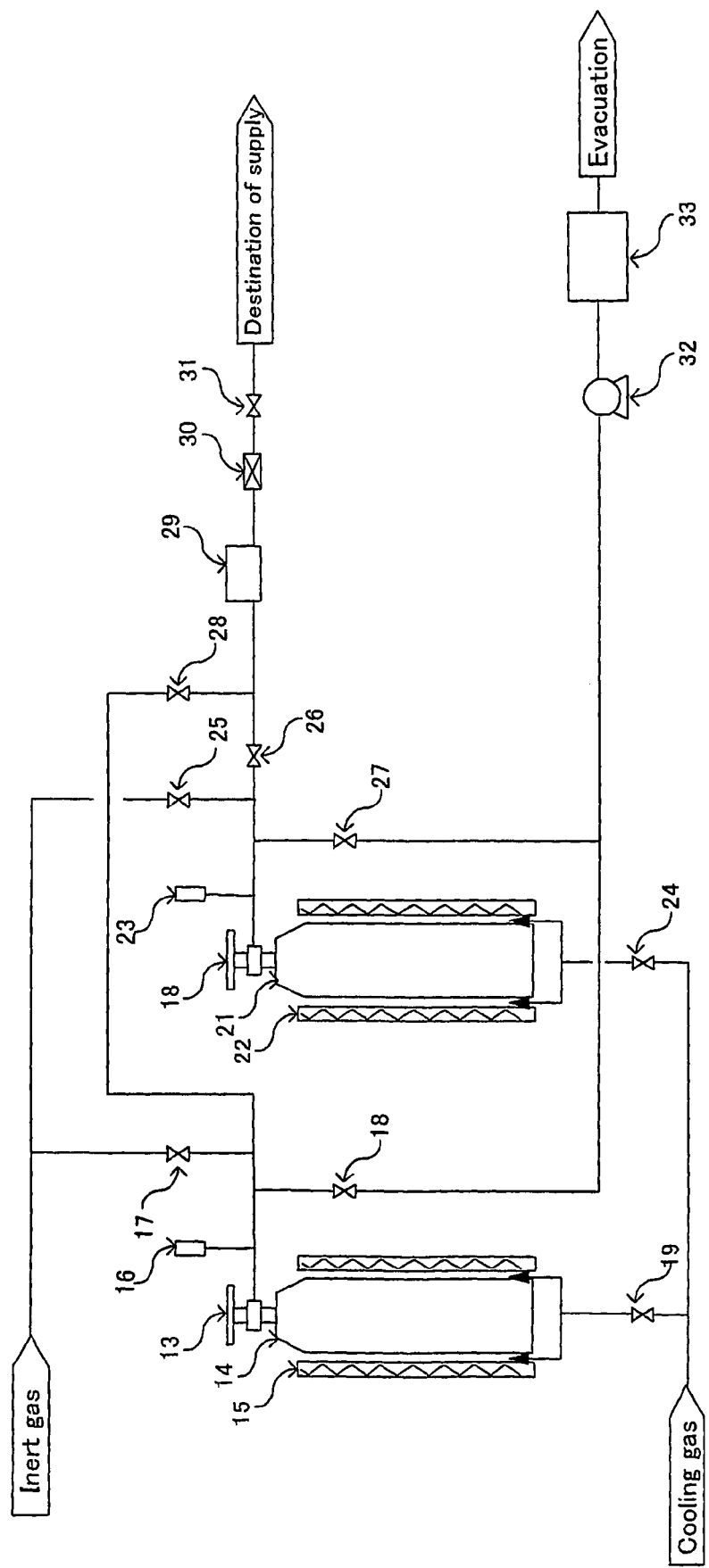
FIG. 2 is a schematic view showing an example of a fluorine gas supply apparatus used in the present invention.

By connecting the fluorine gas generation container to such a fluorine supply apparatus as shown in FIG. 2, a high-purity fluorine gas can be supplied without using a fluorine electrolytic cell or a fluorine cylinder. That is to say, by providing the fluorine gas generation container manufactured by the supplier to the destination of supply (user), the user can use a high-purity fluorine gas without investing in an expensive and dangerous fluorine electrolytic cell.

The process for producing a fluorine gas of the invention is a process by which an extremely highly pure fluorine gas can be obtained and which is more inexpensive and safer as compared with the processes hitherto proposed. Accordingly, the high-purity fluorine gas obtained by the process of the invention can be used in various fields including fields of electronic industry such as a field of semiconductors or liquid crystals. Further, in case of fluorination of inorganic compounds or organic compounds using the high-purity fluorine gas, formation of impurities due to side reaction does not take place and products of higher quality can be manufactured because impurities such as $O_2$, $N_2$ and $CO_2$ are rarely contained in the fluorine gas.

EXAMPLES

The present invention is further described with reference to the following examples, but it should be construed that the invention is in no way limited to those examples.

Figure 3:
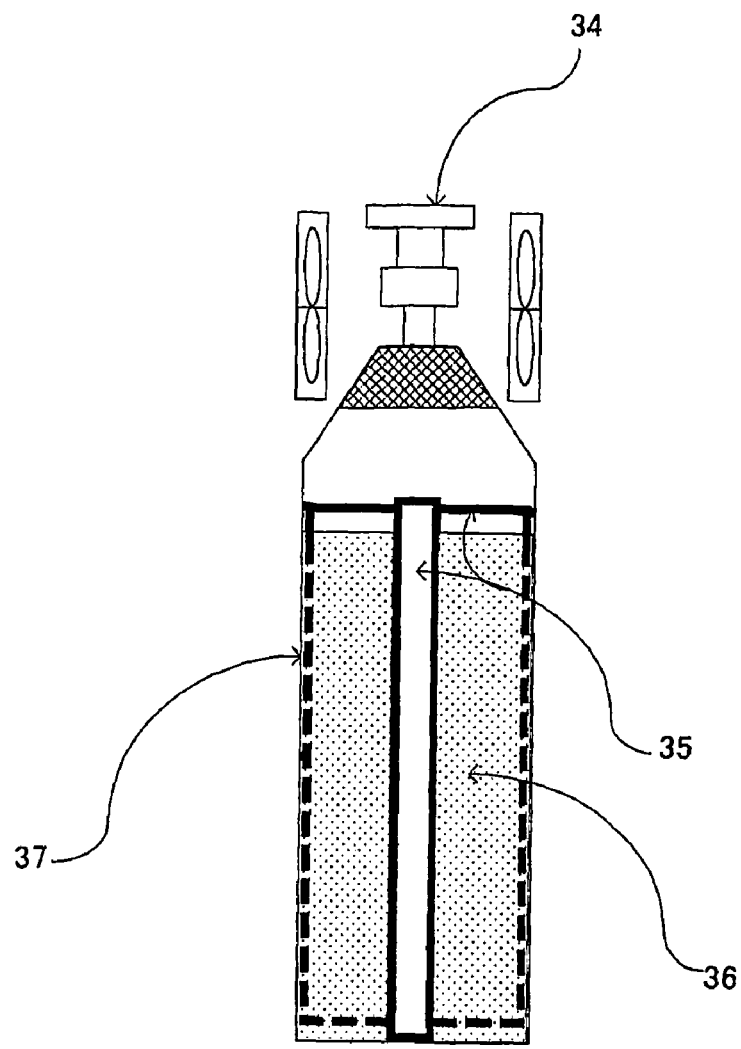
FIG. 3 is a schematic view showing an example of a fluorine gas generation container used in the present invention.
Figure 3:
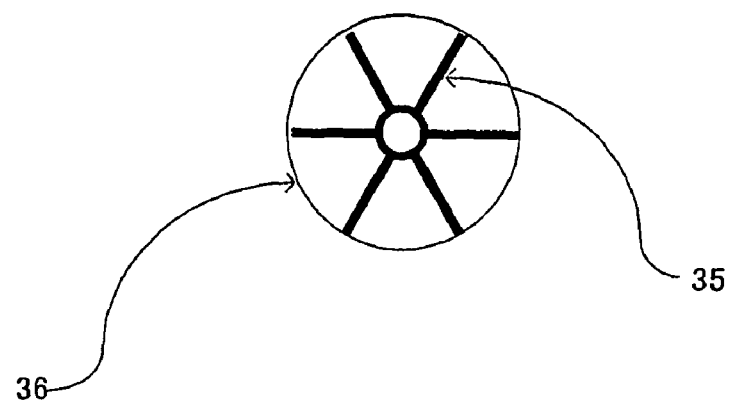

In the following examples, a 18-liter Ni container (φ150 mm×1000 mm) was used as a fluorine generating agent container 37, and the container was filled with 10 kg of dry $MnF_4$ as a fluorine generating agent 36, as shown in FIG. 3. As the container 37, not only a container equipped with a heat-transfer structure 38 in which a foam metal 39 was sandwiched between punching plates 40 and 41 as shown in FIG. 4 was prepared but also a container equipped with a heat transfer member without a foam metal and a container equipped with no heat transfer member were prepared for the comparison of effects of the foam metal 39.

Example 1

To such a fluorine gas generation/occlusion apparatus as shown in FIG. 1, a fluorine generating agent container 10 equipped with a heat-transfer structure having a foam metal sandwiched between punching plates and filled with 10 kg of $MnF_4$ was connected, and then a valve 3 and a valve 8 were used to perform vacuum accumulation purging of a connection opening and thereby perform drying of the connection opening. Thereafter, the container 10 was heated to 400° C. by means of a heater 9 and was simultaneously evacuated by a vacuum pump 11 to remove a fluorine gas generated. The fluorine gas at this time was analyzed, and as a result, the HF content was 0.5% by volume. These operations were carried out also on the container equipped with a heat transfer member without a foam metal and the container equipped with no heat transfer member. The fluorine gas liberation time in each container is set forth in Table 1.

TABLE 1

| Container | | Fluorine gas |
|---|---|---|
| Heat transfer member 35 | Foam metal 39 | liberation time ($MnF_4 \rightarrow MnF_3$) |
| present | present | 12 hrs |
| present | absent | 14 hrs |
| absent | absent | 22 hrs |

Example 2

The same operations as in Example 1 were carried out, and then $MnF_3$ remaining after generation of a fluorine gas was allowed to occlude a fluorine gas. As the fluorine gas for occlusion, a fluorine gas having a purity of 99.5% was used. In this operation, the fluorine gas was allowed to pass through a NaF-filled barrel 7 to remove HF contained in the fluorine gas. With controlling a flow rate of the fluorine gas by a mass flow controller 5, the fluorine gas was fed at a pressure of 0.4 MPa (gauge pressure) by means of a valve 4 to the container 10 having been controlled to a temperature of 350° C. These operations were carried out also on the container equipped with a heat transfer member without a foam metal and the container equipped with no heat transfer member. The fluorine gas feed time (occlusion time) in each container is set forth in Table 2.

TABLE 2

| Container | | Treatment time |
| --- | --- | --- |
| Heat transfer member 35 | Foam metal 39 | ($MnF_3 \rightarrow MnF_4$) |
| present | present | 15 hrs |
| present | absent | 19 hrs |
| absent | absent | 25 hrs |

Example 3

The container of Example 2 filled with the fluorine generating agent, which had been obtained by allowing manganese fluoride after generation of a fluorine gas to occlude a fluorine gas and thereby converting the manganese fluoride into $MnF_4$, was connected to such a fluorine gas supply apparatus as shown in FIG. 2. Thereafter, the container 14 (or 21) was heated to 400° C. to generate a fluorine gas. The pressure of the fluorine gas at this time was 0.8 MPa (gauge pressure). With measuring a maximum flow rate by a mass flow controller 29, supply of the generated fluorine gas was carried out. These operations were carried out also on the container equipped with a heat transfer member without a foam metal and the container equipped with no heat transfer member. The fluorine gas generation rate in each container is set forth in Table 3.

A conversion of $MnF_4$ into $MnF_3$ was determined in the following manner. $MnF_3$ was dissolved in a nitric acid aqueous solution, then Mn concentration of the solution was measured by ICP analysis and F concentration was measured by ion chromatograph analysis to determine a proportion of $MnF_3$. The values in the course of the reaction were calculated from the weight of the filled fluorine generating agent. With regard to the fluorine gas generated in this case (in case of using the container equipped with a heat-transfer structure having a foam metal sandwiched between punching plates), the purity was analyzed by gas chromatography and FT-IR. The results of analyses of impurity gases contained in the fluorine gas are set forth in Table 4.

TABLE 3

| Container | | Fluorine gas generation rate (L/min) | | | | | |
| --- | --- | --- | --- | --- | --- | --- | --- |
| Heat transfer member | Foam metal | Conversion of $MnF_4 \rightarrow MnF_3$ | | | | | |
| | | 0% | 20% | 40% | 60% | 80% | 90% |
| present | present | 3.8 | 3.4 | 3.1 | 3.0 | 2.8 | 1.8 |
| present | absent | 2.2 | 2.1 | 2.0 | 1.8 | 1.5 | 1.3 |
| absent | absent | 1.7 | 1.7 | 1.7 | 1.6 | 1.2 | 0.8 |

TABLE 4

| | $O_2$ | $N_2$ | $CO_2$ | $SiF_4$ | $CF_4$ | HF |
| --- | --- | --- | --- | --- | --- | --- |
| Concentration (ppm by volume) | <10 | <10 | <10 | <10 | <10 | <100 |

Example 4

The fluorine generating agent container 14 (or 21) connected to such a fluorine gas supply apparatus as shown in FIG. 2 was heated to 400° C. to generate a fluorine gas in the same manner as in Example 3. Then, the flow rate of the fluorine gas was controlled to 1 liter/min by means of a mass flowmeter 29 to supply the fluorine gas. The Mn concentration of the fluorine gas was measured at the feed opening.

Figure 5:
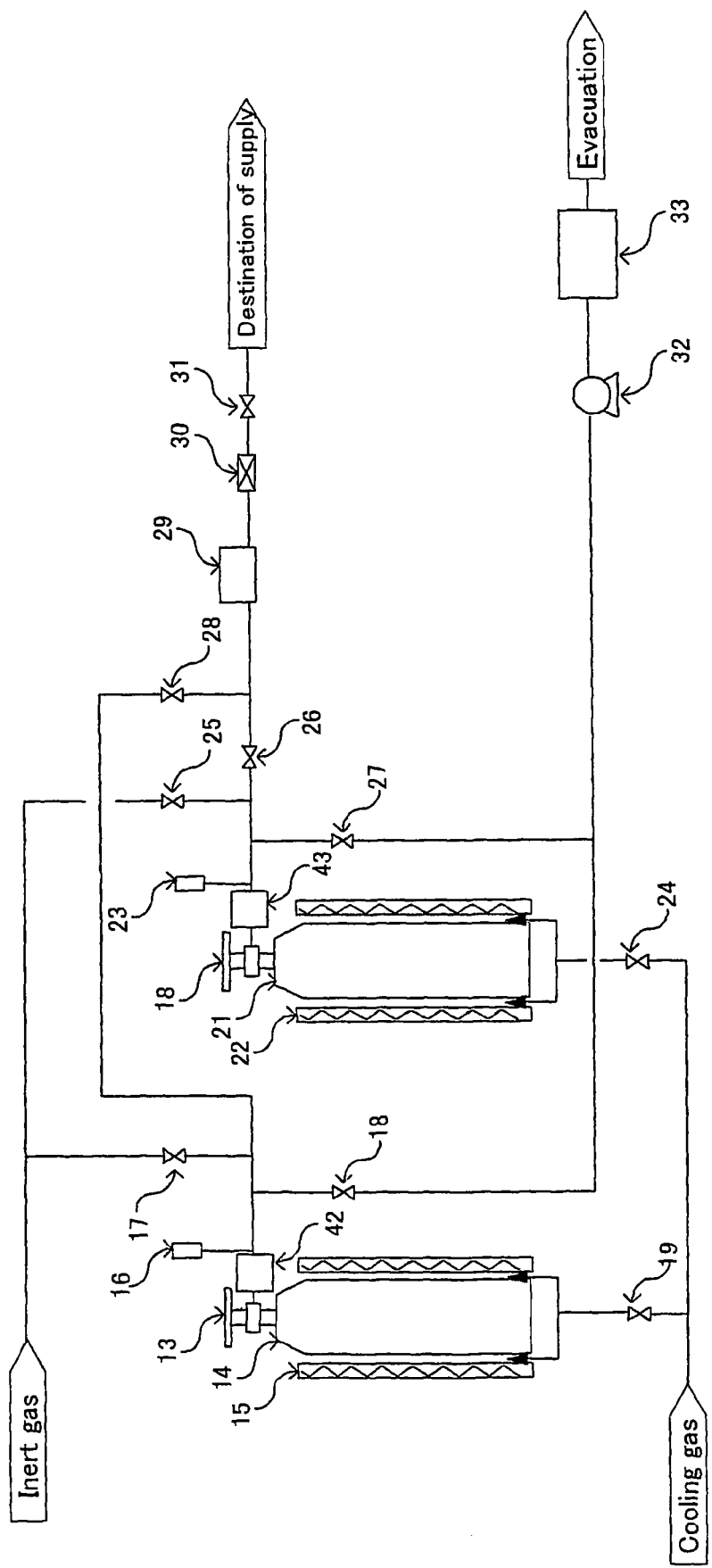
FIG. 5 is a schematic view showing an example of a fluorine gas supply apparatus used in the present invention.

Then, such a metal fluoride container 42 (or 43) filled with NaF as shown in FIG. 5 was installed midway the line to the feed opening, and this container was heated to 100 C. To the fluorine gas supply apparatus, the fluorine generating agent container 14 (or 21) was connected and heated to 400° C. to generate a fluorine gas in the same manner as in Example 3. Then, the flow rate of the fluorine gas was controlled to 1 liter/min by means of a mass flowmeter 29 to supply the fluorine gas. The Mn concentration of the fluorine gas was measured at the feed opening. The results of Mn concentration measurements are set forth in Table 5.

TABLE 5

| NaF-filled container | Mn concentration (ppb by weight, $F_2$ gas) |
| --- | --- |
| absent | 2.4 |
| present | <0.1 |

Example 5

The fluorine generating agent container 14 (or 21) connected to such a fluorine gas supply apparatus as shown in FIG. 2 was heated to 400° C. to generate a fluorine gas in the same manner as in Example 3. Then, the flow rate of the fluorine gas was controlled to 1 liter/min by means of a mass flowmeter to supply the fluorine gas. The Mn concentration of the fluorine gas was measured at the feed opening.

Figure 6:
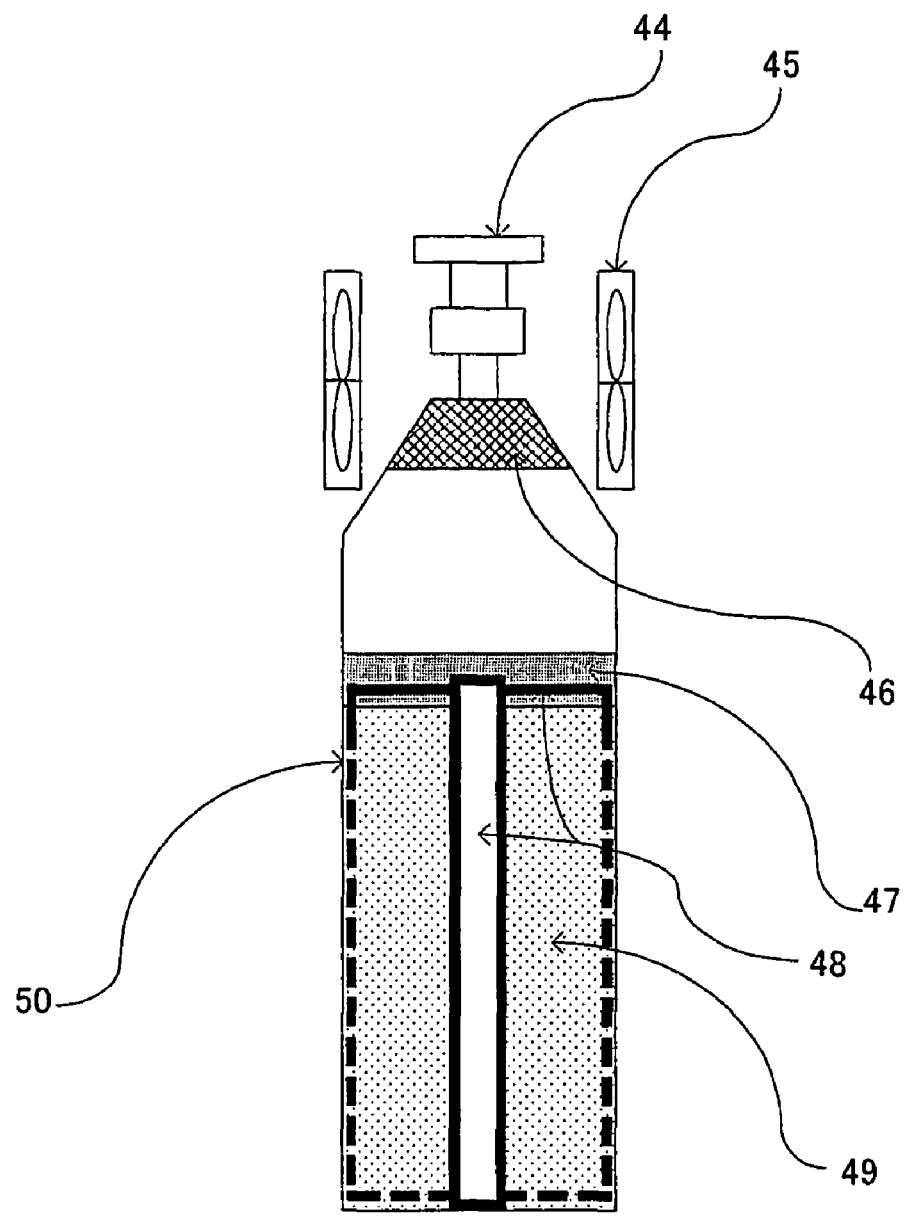
FIG. 6 is a schematic view showing an example of a fluorine gas generation container used in the present invention.

Then, such a fluorine generating agent container 50 as shown in FIG. 6 was filled with 10 kg of $MnF_4$ as a fluorine generating agent 49 and further filled thereon with 1 kg of a powder of NaF as a metal fluoride 47 for removal. The size, material, etc. of the container 50 were the same as those of the container used in Examples 1 to 4. After generation and occlusion of a fluorine gas were carried out in the same manner as in Examples 1 and 2, the container 14 (or 21) connected to such a fluorine gas supply apparatus as shown in FIG. 2 was heated to 400° C. to generate a fluorine gas in the same manner as in Example 3. Then, the flow rate of the fluorine gas was controlled to 1 liter/min by means of a mass flowmeter to supply the fluorine gas. The Mn concentration of the fluorine gas was measured at the feed opening. The results of Mn concentration measurements are set forth in Table 6.

TABLE 6

| Filling with metal fluoride 47 | Mn concentration (ppb by weight, $F_2$ gas) |
| --- | --- |
| not done | 2.4 |
| done | <0.1 |

The invention claimed is:
1. A process for producing a fluorine gas, comprising a step (1) of generating a fluorine gas by sectioning the interior of a fluorine gas generation container equipped with a heating means, by the use of a heat-transfer structure comprising a foam metal sandwiched between metal punching plates, then filling each section with a high-valence metal fluoride and heating the high-valence metal fluoride.

2. The process for producing a fluorine gas as claimed in claim 1, wherein the high-valence metal fluoride contains at least one composition selected from $MnF_x$ (x=3-4) and $K_3NiF_y$ (y=6-7).

3. The process for producing a fluorine gas as claimed in claim 1, wherein the high-valence metal fluoride comprises $MnF_x$ (x=3-4).

4. The process for producing a fluorine gas as claimed in claim 1, wherein the temperature for heating the high-valence metal fluoride in the step (1) is in the range of 300 to 450° C.

5. The process for producing a fluorine gas as claimed in claim 1, which comprises allowing the high-valence metal fluoride prior to step (1) to occlude a fluorine gas.

6. The process for producing a fluorine gas as claimed in claim 3, which comprises a step of removing manganese fluoride impurity contained in the fluorine gas generated by heating the high-valence metal fluoride.

7. The process for producing a fluorine gas as claimed in claim 6, wherein the step of removing manganese fluoride is carried out by cooling the fluorine gas containing the manganese fluoride.

8. The process for producing a fluorine gas as claimed in claim 7, wherein the temperature for cooling the fluorine gas containing the manganese fluoride is in the range of −50 to 200° C.

9. The process for producing a fluorine gas as claimed in claim 6, wherein the step of removing manganese fluoride is carried out by bringing the fluorine gas containing the manganese fluoride into contact with a metal fluoride.

10. The process for producing a fluorine gas as claimed in claim 9, wherein the metal fluoride used in the step of removing manganese fluoride contains at least one metal selected from the group consisting of an alkali metal, an alkaline earth metal, Al, Cu, Zn and Fe.

11. The process for producing a fluorine gas as claimed in claim 9, wherein the metal fluoride used in the step of removing manganese fluoride is NaF.

* * * * *